United States Patent
Takenaka et al.

(10) Patent No.: US 12,066,466 B2
(45) Date of Patent: Aug. 20, 2024

(54) CURRENT MEASUREMENT DEVICE FOR MEASURING CURRENTS FLOWING IN MUTUALLY OPPOSITE DIRECTIONS

(71) Applicant: Yokogawa Electric Corporation, Tokyo (JP)

(72) Inventors: Kazuma Takenaka, Musashino (JP); Tetsuya Ishikawa, Musashino (JP); Minako Terao, Musashino (JP); Kotaro Ogawa, Musashino (JP); Saki Kobako, Musashino (JP); Naoki Noguchi, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 263 days.

(21) Appl. No.: 17/609,984

(22) PCT Filed: May 11, 2020

(86) PCT No.: PCT/JP2020/018802
§ 371 (c)(1),
(2) Date: Nov. 9, 2021

(87) PCT Pub. No.: WO2020/230753
PCT Pub. Date: Nov. 19, 2020

(65) Prior Publication Data
US 2022/0214383 A1    Jul. 7, 2022

(30) Foreign Application Priority Data
May 14, 2019  (JP) .................. 2019-091311

(51) Int. Cl.
*G01R 15/20*    (2006.01)
*G01D 5/14*    (2006.01)
*G01R 19/00*    (2006.01)

(52) U.S. Cl.
CPC ............ *G01R 15/207* (2013.01); *G01D 5/14* (2013.01); *G01R 19/0092* (2013.01)

(58) Field of Classification Search
CPC .... G01D 5/14; G01R 15/207; G01R 19/0092; G01R 33/0094; G01R 33/0206
See application file for complete search history.

(56) References Cited

U.S. PATENT DOCUMENTS

2011/0202295 A1*   8/2011  Tamura .................. G01R 15/20
                                                                    702/64
2015/0022199 A1*   1/2015  Mito .................... G01R 33/091
                                                                    324/252

(Continued)

FOREIGN PATENT DOCUMENTS

CN    108459192 A    8/2018
EP    3581946 A1   12/2019

(Continued)

OTHER PUBLICATIONS

Dilhara et al., "Sensor Platform for Non-Invasive Ubiquitous Current Sensing", 2016 10th International Conference on Sensing Technology (ICST), IEEE, 2016, total 5 pages; Cited in ESR.

*Primary Examiner* — Jay Patidar
(74) *Attorney, Agent, or Firm* — RANKIN, HILL & CLARK LLP

(57) ABSTRACT

A current measurement device includes: four or more triaxial magnetic sensors arranged to have predefined positional relationships such that magnetism-sensing directions thereof are parallel to each other; and a calculator configured to calculate currents flowing through a pair of conductors to be measured, which are arranged in proximity to each other, based on detection results of the four or more triaxial magnetic sensors and the positional relationships between (Continued)

the four or more triaxial magnetic sensors, the currents flowing in mutually opposite directions.

6 Claims, 6 Drawing Sheets

(56) References Cited

U.S. PATENT DOCUMENTS

2018/0164348 A1 6/2018 Donolo
2019/0293689 A1* 9/2019 Lerner ................. G01R 15/202

FOREIGN PATENT DOCUMENTS

| JP | 2005-55300 A | 3/2005 |
| JP | 2011-164019 A | 8/2011 |
| WO | 2018/146964 A1 | 8/2018 |

* cited by examiner

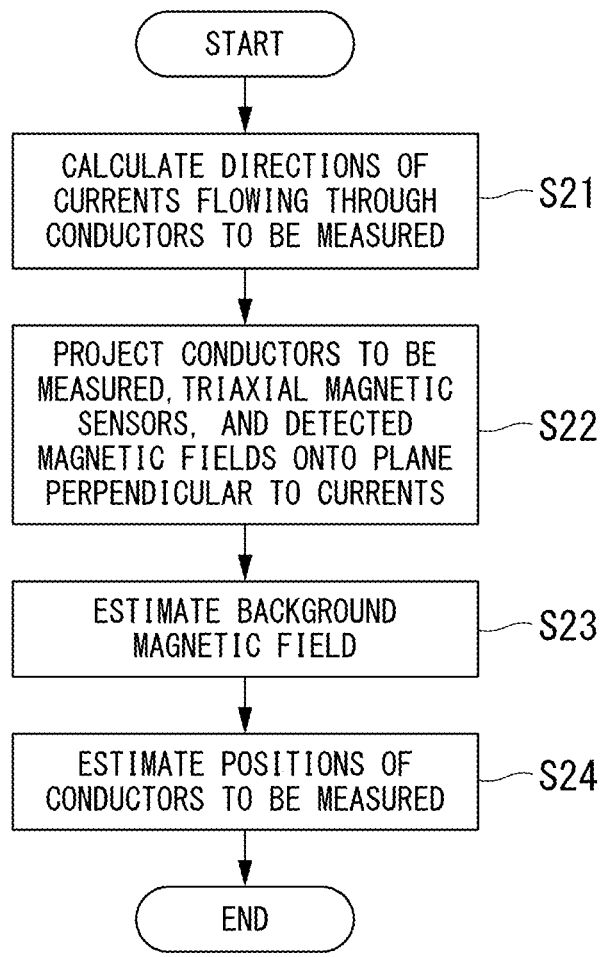

CURRENT MEASUREMENT DEVICE FOR MEASURING CURRENTS FLOWING IN MUTUALLY OPPOSITE DIRECTIONS

TECHNICAL FIELD

An aspect of the present invention relates to a current measurement device.

Priority is claimed on Japanese Patent Application No. 2019-091311, filed May 14, 2019, the content of which is incorporated herein by reference.

BACKGROUND ART

Conventionally, various current measurement devices capable of directly measuring a current flowing through a conductor to be measured in a non-contact mode have been developed. Representative examples of the current measurement devices include a current transformer (CT) type current measurement device, a zero-flux type current measurement device, a Rogowski-type current measurement device, a Hall element type current measurement device, and the like.

For example, in the CT type and zero-flux type current measurement devices, a magnetic core on which a winding is wound is provided near a conductor to be measured and a current flowing through the winding (a secondary side) is detected such that a magnetic flux generated in the magnetic core due to a current flowing through the conductor to be measured (a primary side) is canceled out. Thereby, the CT type and zero-flux type current measurement devices measure the current flowing through the conductor to be measured.

Also, in a Rogowski-type current measurement device, a Rogowski coil (an air-core coil) is provided near a conductor to be measured and a magnetic field generated due to an alternating current flowing through the conductor to be measured interlinks with the Rogowski coil, such that a voltage induced in the Rogowski coil is detected. Thereby, the Rogowski-type current measurement device measures the current flowing through the conductor to be measured.

The following Patent Literature 1 discloses an example of the zero-flux type current measurement device. Also, the following Patent Literature 2 discloses a current measurement device using a plurality of magnetic sensors. Specifically, in the current measurement device disclosed in the following Patent Literature 2, two magnetic sensors are disposed at different distances from a conductor to be measured, the distances between the magnetic sensors and the conductor to be measured are calculated from outputs of the magnetic sensors, and a magnitude of a current flowing through the conductor to be measured is calculated using the calculated distances.

CITATION LIST

Patent Literatures

[Patent Literature 1]
Japanese Unexamined Patent Application, First Publication No. 2005-55300
[Patent Literature 2]
Japanese Unexamined Patent Application, First Publication No. 2011-164019

SUMMARY OF INVENTION

Technical Problem

Incidentally, a plurality of conductors to be measured, which are current measurement targets, may be arranged in proximity to each other. For example, a pair of conductors to be measured through which currents flow in mutually opposite directions may be arranged in proximity and parallel to each other. In this case, there are a current path of a current flowing through one of the conductors to be measured (for example, an outward path) and a current path of a current flowing through the other conductor to be measured (for example, a return path).

In this case, if an attempt is made to measure the current flowing through one of the pair of current paths, the measurement accuracy may deteriorate due to an influence of the magnetic field generated due to the current flowing through the other current path. Specifically, if an attempt is made to measure the current flowing along the outward path, there is an influence of a magnetic field generated due to the current flowing along the return path. In contrast, if an attempt is made to measure the current flowing along the return path, there is an influence of a magnetic field generated due to the current flowing along the outward path. Also, in this case, a distance between the current paths is short and, for example, it may be often difficult to install the above-described magnetic core near the conductor to be measured.

An aspect of the present invention has been made in view of the above circumstances and an objective of the present invention is to provide a current measurement device capable of flexibly arranging current paths along which currents flow in mutually opposite directions and which are arranged in proximity to each other and accurately measuring the currents flowing along the current paths in a non-contact mode.

Solution to Problem

To solve the above-described problem, a current measurement device (1) according to one aspect of the present invention includes: four or more triaxial magnetic sensors (11 to 14) arranged to have predefined positional relationships such that magnetism-sensing directions thereof are parallel to each other; and a calculator (25) configured to calculate currents flowing through a pair of conductors (MC1, MC2) to be measured, which are arranged in proximity to each other, based on detection results of the four or more triaxial magnetic sensors and the positional relationships between the four or more triaxial magnetic sensors, the currents flowing in mutually opposite directions.

In addition, in the current measurement device according to one aspect of the present invention, the calculator includes: a position estimator (25b) configured to estimate positions (VA, VB, or vA, vB) of the pair of conductors to be measured using the detection results of the four or more triaxial magnetic sensors and the positional relationships between the four or more triaxial magnetic sensors; and a current calculator (25d) configured to calculate the currents flowing through the pair of conductors to be measured based on the positions estimated by the position estimator and the detection results of the four or more triaxial magnetic sensors.

In addition, in the current measurement device according to one aspect of the present invention, the calculator includes a background magnetic field estimator (25c) configured to estimate a background magnetic field ($\phi$ or $\Phi$) uniformly acting on the four or more triaxial magnetic sensors based on the detection results of the four or more triaxial magnetic sensors and the positional relationships between the four or more triaxial magnetic sensors, wherein the current calculator calculates the currents flowing through the pair of conductors to be measured based on the positions estimated by the position estimator, the detection results of the four or more triaxial magnetic sensors, and the background magnetic field estimated by the background magnetic field estimator.

In addition, in the current measurement device according to one aspect of the present invention, the calculator further includes a noise remover (25a) configured to remove noise components included in the detection results of the four or more triaxial magnetic sensors, wherein the calculator calculates the currents flowing through the pair of conductors to be measured using the detection results of the four or more triaxial magnetic sensors from which the noise components have been removed by the noise remover.

In addition, in the current measurement device according to one aspect of the present invention, the noise remover removes the noise components included in the detection results of the four or more triaxial magnetic sensors by separately performing an averaging process or a root sum square process on each of the detection results of the four or more triaxial magnetic sensors obtained for each predefined given period.

In addition, in the current measurement device according to one aspect of the present invention, the current measurement device includes: a sensor head (10) including the four or more triaxial magnetic sensors; and a circuit (20) including the calculator.

In addition, in the current measurement device according to one aspect of the present invention, signals indicating the detection results of the four or more triaxial magnetic sensors are digital signals.

In addition, in the current measurement device according to one aspect of the present invention, when magnetic fields obtained by projecting the detection results of the four or more triaxial magnetic sensors onto a complex plane are denoted by $h_m$, the currents flowing through the pair of conductors to be measured are denoted by I, positions of the four or more triaxial magnetic sensors projected onto the complex plane are denoted by $p_m$, the positions of the pair of conductors to be measured on the complex plane are denoted by $v_A$ and $v_B$, and a background magnetic field on the complex plane is denoted by $\varphi$, the calculator calculates the current I using an equation of:

$$I = \left| 2\pi(h_m - \varphi) \frac{(p_m - v_A)^*(p_m - v_B)^*}{(v_A - v_B)^*} \right|. \quad \text{[Math. 1]}$$

In addition, in the current measurement device according to one aspect of the present invention, when magnetic fields, which are the detection results of the four or more triaxial magnetic sensors, are denoted by $H_m$, the currents flowing through the pair of conductors to be measured are denoted by I, a unit vector of a direction in which the current I flows is denoted by j, a background magnetic field obtained by restoring a background magnetic field on a complex plane to an XYZ Cartesian coordinate system is denoted by $\Phi$, and vectors parallel to perpendicular lines drawn from each of the four or more triaxial magnetic sensors to the pair of conductors to be measured are denoted by $r_{Am}$ and $r_{Bm}$, the calculator calculates the current I using an equation of:

$$I = 2\pi(H_m - \Phi) \frac{\|r_{Am}\|^2 \|r_{Bm}\|^2}{\|r_{Bm}\|^2 (j \times r_{Am}) - \|r_{Am}\|^2 (j \times r_{Bm})}. \quad \text{[Math. 2]}$$

Advantageous Effects of Invention

According to one aspect of the present invention, it is possible to flexibly arrange current paths along which currents flow in mutually opposite directions and which are arranged in proximity to each other and accurately measure the currents flowing along the current paths in a non-contact mode.

BRIEF DESCRIPTION OF DRAWINGS

FIG. 6 is a flowchart showing details of the processing of step S14 in FIG. 5.

DESCRIPTION OF EMBODIMENTS

Figure 1:
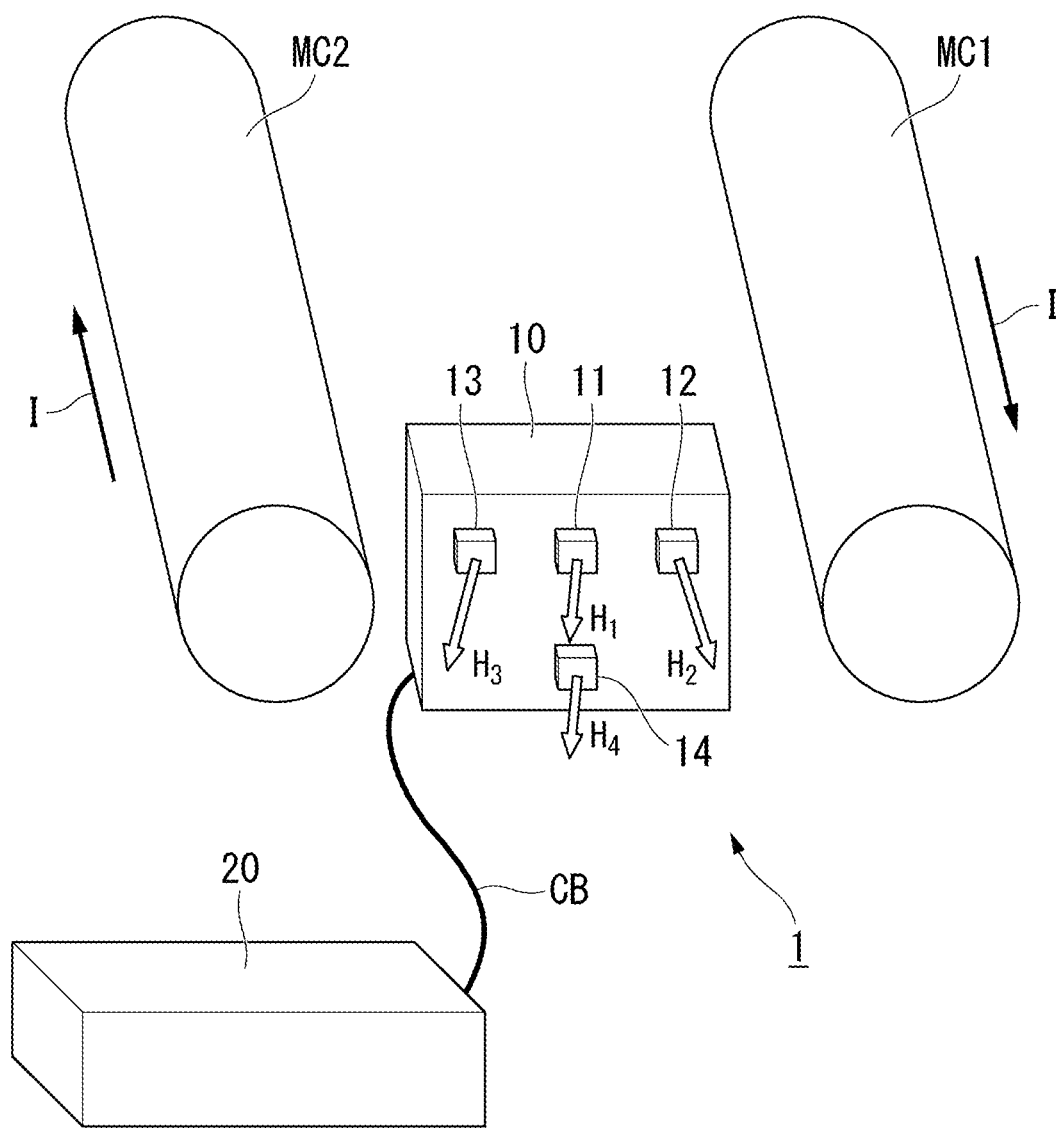
FIG. 1 is a diagram schematically showing a current measurement device according to an embodiment of the present invention.

Hereinafter, a current measurement device according to an embodiment of the present invention will be described in detail with reference to the drawings. Hereinafter, the overview of the embodiment of the present invention will be first described and then details of the embodiment of the present invention will be described.

[Overview]

The embodiment of the present invention is configured such that it is possible to flexibly arrange current paths along which currents flow in mutually opposite directions and which are arranged in proximity to each other and accurately measure the currents flowing along the current paths in a non-contact mode. Specifically, it is possible to measure currents of the same magnitude flowing along the current paths in mutually opposite directions in a non-contact mode with high accuracy in consideration of both a magnetic field generated due to the current flowing along one of the current paths (for example, an outward path) and a magnetic field generated due to the current flowing along the other one of the current paths (for example, a return path). At this time, a position or an orientation related to the current path is not limited and accurate current measurement is enabled with a flexible arrangement.

In recent years, in a process of developing hybrid vehicles (HVs) and electric vehicles (EVs), a current flowing through a pin of a power semiconductor such as silicon carbide (SiC) or a current flowing through an assembled bus bar has been required to be directly measured. Many power semiconductors have narrow pin pitches. A bus bar may be installed in an area where a nearby space is limited. For the above power semiconductor or bus bar and the like, a current measurement device capable of being flexibly installed at the time of current measurement is desirable. Also, in a hybrid vehicle or an electric vehicle, for example, a direct current supplied from a battery or an alternating current flowing through a motor is handled. Thus, a current measurement device capable of measuring a direct current and an alternating current of a low frequency (for example, about several hundred hertz [Hz] or less) in a non-contact mode is desirable.

However, in the zero-flux type current measurement device disclosed in Patent Literature 1 described above, it is necessary to provide a magnetic core having a certain size near the conductor to be measured. Thus, it is difficult to install the zero-flux type current measurement device disclosed in Patent Literature 1 in a small space. Also, the Rogowski-type current measurement device described above detects the voltage induced in the Rogowski coil. Thus, the Rogowski-type current measurement device cannot measure a direct current in principle. Also, in a low-frequency region, an output signal is weak and a phase shifts, such that the measurement accuracy is poor. Also, in the current measurement device disclosed in Patent Literature 2 described above, it is necessary to cause a magnetism-sensing direction of the magnetic sensor to match a circumferential direction of the conductor to be measured. Thus, in the current measurement device disclosed in Patent Literature 2, the arrangement of the magnetic sensor is limited and it is difficult to arrange the magnetic sensor flexibly.

Also, the current generally flows out from a positive electrode of a power supply and then flows into a negative electrode of the power supply via a load or the like. Thus, the current path of the current supplied from the power supply includes a path along which the current flows out from the positive electrode of the power supply (the outward path) and a path along which the current flows into the negative electrode of the power supply (the return path). Furthermore, the former path may be referred to as the return path and the latter path may be referred to as the outward path. Thus, for example, if an attempt is made to measure the current flowing along the outward path, there is an influence of a magnetic field generated due to the current flowing along the return path. In contrast, if an attempt is made to measure the current flowing along the return path, there is an influence of the magnetic field generated due to the current flowing along the outward path. Consequently, the current measurement accuracy may deteriorate.

In the embodiment of the present invention, there are provided four or more triaxial magnetic sensors arranged to have predefined positional relationships such that magnetism-sensing directions thereof are parallel to each other; and a calculator configured to calculate currents flowing through a pair of conductors to be measured, which are arranged in proximity to each other, based on detection results of the four or more triaxial magnetic sensors and the positional relationships between the four or more triaxial magnetic sensors, wherein the currents flow in mutually opposite directions. When the currents are calculated, positions or orientations of the triaxial magnetic sensors (i.e., the four or more triaxial magnetic sensors arranged to have the predefined positional relationships) with respect to the pair of conductors to be measured are arbitrary. Thereby, it is possible to flexibly arrange current paths along which currents flow in mutually opposite directions and which are arranged in proximity to each other and accurately measure the currents flowing along the current paths in a non-contact mode.

EMBODIMENT

<Configuration of Current Measurement Device>

FIG. 1 is a diagram schematically showing a current measurement device 1 according to an embodiment of the present invention. As shown in FIG. 1, the current measurement device 1 of the present embodiment includes a sensor head 10 and a circuit 20 connected by a cable CB. The above current measurement device 1 directly measures currents I flowing through a pair of conductors MC1 and MC2 to be measured, which are arranged in proximity and parallel to each other, in a non-contact mode, wherein the currents I flow in mutually opposite directions.

Here, the fact that the conductors MC1 and MC2 to be measured are in proximity to each other indicates a case in which a distance set between the conductors MC1 and MC2 to be measured is so narrow that the magnetic field generated due to the current flowing through one of the conductors MC1 and MC2 to be measured cannot be considered to uniformly act on a plurality of triaxial magnetic sensors (whose details will be described below) provided in the sensor head 10. In other words, this indicates a case in which a distance set between the conductors MC1 and MC2 to be measured is so narrow that the magnetic field generated due to the above-described current non-uniformly acts on the above-described plurality of triaxial magnetic sensors.

Furthermore, for example, the conductors MC1 and MC2 to be measured are any conductors such as pins and bus bars of power semiconductors. Hereinafter, for simplicity of description, a case in which the conductors MC1 and MC2 to be measured are cylindrical conductors will be described. The currents I flowing through the conductors MC1 and MC2 to be measured flow in mutually opposite directions. Hereinafter, a current path of the current flowing through the conductor MC1 to be measured may be referred to as an "outward path" and a current path of the current flowing through the conductor MC2 to be measured may be referred to as a "return path."

The sensor head 10 is a member arranged at any position in any orientation with respect to the conductors MC1 and MC2 to be measured so that the currents I flowing through the conductors MC1 and MC2 to be measured are measured in a non-contact mode. The sensor head 10 is formed of a material (for example, resin or the like) that does not block magnetic fields (for example, magnetic fields $H_1$, $H_2$, $H_3$, and $H_4$ shown in FIG. 1) generated due to the currents I flowing through the conductors MC1 and MC2 to be measured. The sensor head 10 is used as a so-called probe for measuring the currents I flowing through the conductors MC1 and MC2 to be measured in a non-contact mode.

Four triaxial magnetic sensors 11, 12, 13, and 14 are provided in the sensor head 10. The triaxial magnetic sensors 11, 12, 13, and 14 are magnetic sensors having magnetism-sensing directions on three axes orthogonal to each other. The triaxial magnetic sensors 11, 12, 13, and 14 are arranged to have predefined positional relationships so that magnetism-sensing directions thereof are parallel to each other. For example, the triaxial magnetic sensors 11, 12, 13, and 14 are arranged at prescribed intervals in prescribed directions so that first axes of the triaxial magnetic sensors 11, 12, 13, and 14 are parallel to each other, second axes of the triaxial magnetic sensors 11, 12, 13, and 14 are parallel to each other, and third axes of the triaxial magnetic sensors 11, 12, 13, and 14 are parallel to each other. Hereinafter, as shown in FIG. 1, a case in which the triaxial magnetic sensors 13, 11, and 12 are arranged at prescribed intervals in a first axis direction and the triaxial magnetic sensors 11 and 14 are arranged at a prescribed interval in a third axis direction will be described.

Each of signals indicating detection results of the triaxial magnetic sensors 11, 12, 13, and 14 may be either an analog signal or a digital signal. However, when each of the signals indicating the detection results of the triaxial magnetic sensors 11, 12, 13, and 14 is a digital signal, the number of cables CB connecting the sensor head 10 and the circuit 20 can be reduced as compared with when each of the signals indicating the detection results of the triaxial magnetic sensors 11, 12, 13, and 14 is an analog signal.

For example, when the signals indicating the detection results of the triaxial magnetic sensors 11, 12, 13, and 14 are analog signals, three cables CB are required to output triaxial detection results for each of the triaxial magnetic sensors 11, 12, 13, and 14. Thus, a total of 12 cables CB are required. On the other hand, when the signals indicating the detection results of the triaxial magnetic sensors 11, 12, 13, and 14 are digital signals, only one cable CB is required. When the number of cables CB is small, the flexibility of the cables CB is improved, such that handling becomes easy, for example, when the sensor head 10 is arranged within a small space.

The circuit 20 measures the currents I flowing through the conductors MC1 and MC2 to be measured based on the detection results (the detection results of the triaxial magnetic sensors 11, 12, 13, and 14) output from the sensor head 10. The circuit 20 displays results of measuring the currents I or externally outputs the measurement results. Although any cable CB for connecting the sensor head 10 and the circuit 20 can be used, a cable CB, which has flexibility, is easy to handle, and is unlikely to break, is desirable.

Figure 2:
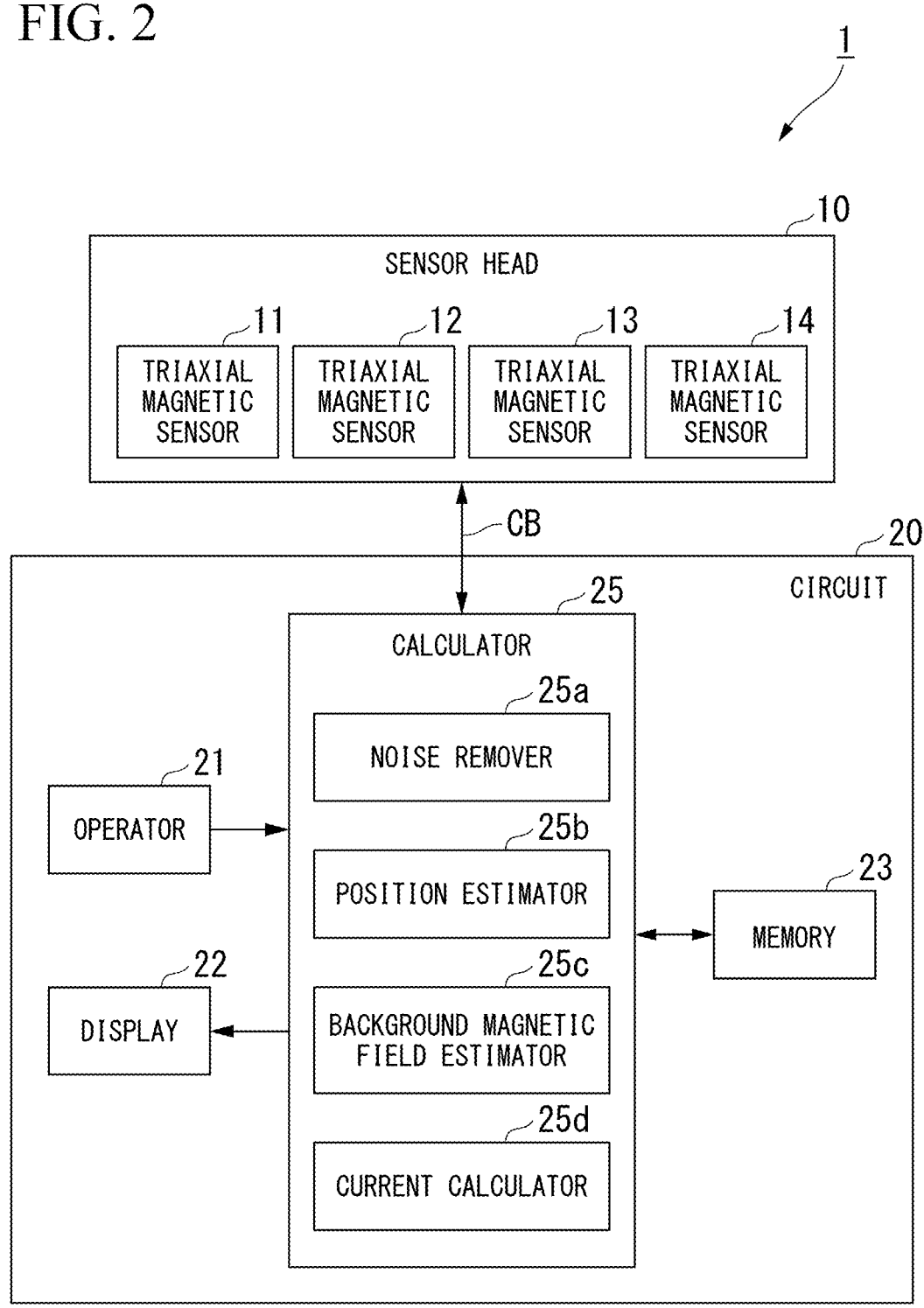
FIG. 2 is a block diagram showing a main configuration of the current measurement device according to the embodiment of the present invention.

FIG. 2 is a block diagram showing a main configuration of the current measurement device 1 according to the embodiment of the present invention. In FIG. 2, the same reference signs are given to blocks corresponding to the components shown in FIG. 1. Hereinafter, details of an internal configuration of the circuit 20 will be mainly described with reference to FIG. 2. As shown in FIG. 2, the circuit 20 includes an operator 21, a display 22, a memory 23, and a calculator 25.

The operator 21 includes various types of buttons such as a power button and a setting button and outputs signals indicating operation instructions for the various types of buttons to the calculator 25. The display 22 includes, for example, a display device such as a 7-segment light emitting diode (LED) display or a liquid crystal display device. The display 22 displays various types of information output from the calculator 25 (for example, information indicating results of measuring the currents I flowing through the conductors MC1 and MC2 to be measured). Furthermore, the operator 21 and the display 22 may be separated physically. Also, the operator 21 and the display 22 may be integrated physically as in a touch panel type liquid crystal display device having both a display function and an operation function.

The memory 23 includes, for example, a volatile or non-volatile semiconductor memory. The memory 23 stores the detection results of the triaxial magnetic sensors 11, 12, 13, and 14 output from the sensor head 10, the calculation results of the calculator 25 (the results of measuring the currents I flowing through the conductors MC1 and MC2 to be measured), and the like. Furthermore, the memory 23 may include an auxiliary storage device such as a hard disk drive (HDD) or a solid-state drive (SSD) together with the above-described semiconductor memory (or instead of the above-described semiconductor memory).

The calculator 25 causes the memory 23 to store the detection results of the triaxial magnetic sensors 11, 12, 13, and 14 output from the sensor head 10. Also, the calculator 25 reads the detection results of the triaxial magnetic sensors 11, 12, 13, and 14 stored in the memory 23 and performs a calculation process of calculating the currents I flowing through the conductors MC1 and MC2 to be measured. The calculator 25 includes a noise remover 25*a*, a position estimator 25*b*, a background magnetic field estimator 25*c*, and a current calculator 25*d*.

The noise remover 25*a* removes noise components included in the detection results of the triaxial magnetic sensors 11, 12, 13, and 14. Specifically, the noise remover 25*a* separately performs an averaging process or a root sum square process on a plurality of detection results obtained from each of the triaxial magnetic sensors 11, 12, 13, and 14 at predefined given intervals (for example, 1 second). Thereby, the noise remover 25*a* removes the noise components included in the detection results of the triaxial magnetic sensors 11, 12, 13, and 14. The triaxial detection results are output from the triaxial magnetic sensors 11, 12, 13, and 14. The noise component removal by the noise remover 25*a* is performed separately for the detection result of each axis. The above noise removal is performed to improve a signal-to-noise (SN) ratio of the triaxial magnetic sensors 11, 12, 13, and 14 to improve the accuracy of measurement of the currents I.

The position estimator 25*b* estimates positions of the conductors MC1 and MC2 to be measured (i.e., positions of the conductors MC1 and MC2 to be measured with respect to the triaxial magnetic sensors 11, 12, 13, and 14) using the detection results of the triaxial magnetic sensors 11, 12, 13, and 14 and the positional relationships between the triaxial magnetic sensors 11, 12, 13, and 14. The above estimation is performed to measure the currents I flowing through the MC2 with high accuracy in consideration of both the magnetic field generated due to the current I flowing through the conductor MC1 to be measured and the magnetic field generated due to the current I flowing through the conductor MC2 to be measured. Furthermore, details of the process performed by the position estimator 25*b* will be described below.

The background magnetic field estimator 25*c* estimates a background magnetic field (for example, geomagnetism) that uniformly acts on the triaxial magnetic sensors 11, 12, 13, and 14 based on the detection results of the triaxial magnetic sensors 11, 12, 13, and 14 and the positional relationships of the triaxial magnetic sensors 11, 12, 13, and 14. The above estimation is performed to measure the currents I flowing through the conductors MC1 and MC2 to be measured with high accuracy by eliminating an influence of the background magnetic field (for example, the geomagnetism). The background magnetic field estimator 25*c* can be omitted when it is not necessary to take into account the influence of the background magnetic field. Furthermore, details of the process performed by the background magnetic field estimator 25*c* will be described below.

The current calculator 25*d* calculates the currents flowing through the conductors MC1 and MC2 to be measured based on the positions estimated by the position estimator 25*b* and the detection results of the triaxial magnetic sensors 11, 12, 13, and 14. Here, when it is necessary to take into account the influence of the background magnetic field, the current calculator 25*d* calculates the currents flowing through the conductors MC1 and MC2 to be measured based on the positions estimated by the position estimator 25*b*, the detection results of the triaxial magnetic sensors 11, 12, 13, and 14, and the background magnetic field estimated by the background magnetic field estimator 25*c*. Furthermore, details of the process performed by the current calculator 25*d* will be described below.

Here, as shown in FIGS. 1 and 2, the circuit 20 is separated from the sensor head 10 and is connected to the sensor head 10 via the cable CB. According to the above configuration, a magnetic field detection function (the triaxial magnetic sensors 11, 12, 13, and 14) and a calculation function (the calculator 25) can be separated. Thus, it is possible to avoid various problems (related to, for example, temperature characteristics, dielectric strength, and installation in a small space) and the like that occur when the calculator 25 is provided within the sensor head 10. Thereby, it is possible to expand the applications of the current measurement device 1.

<Current Measurement Principle>

Figure 3:
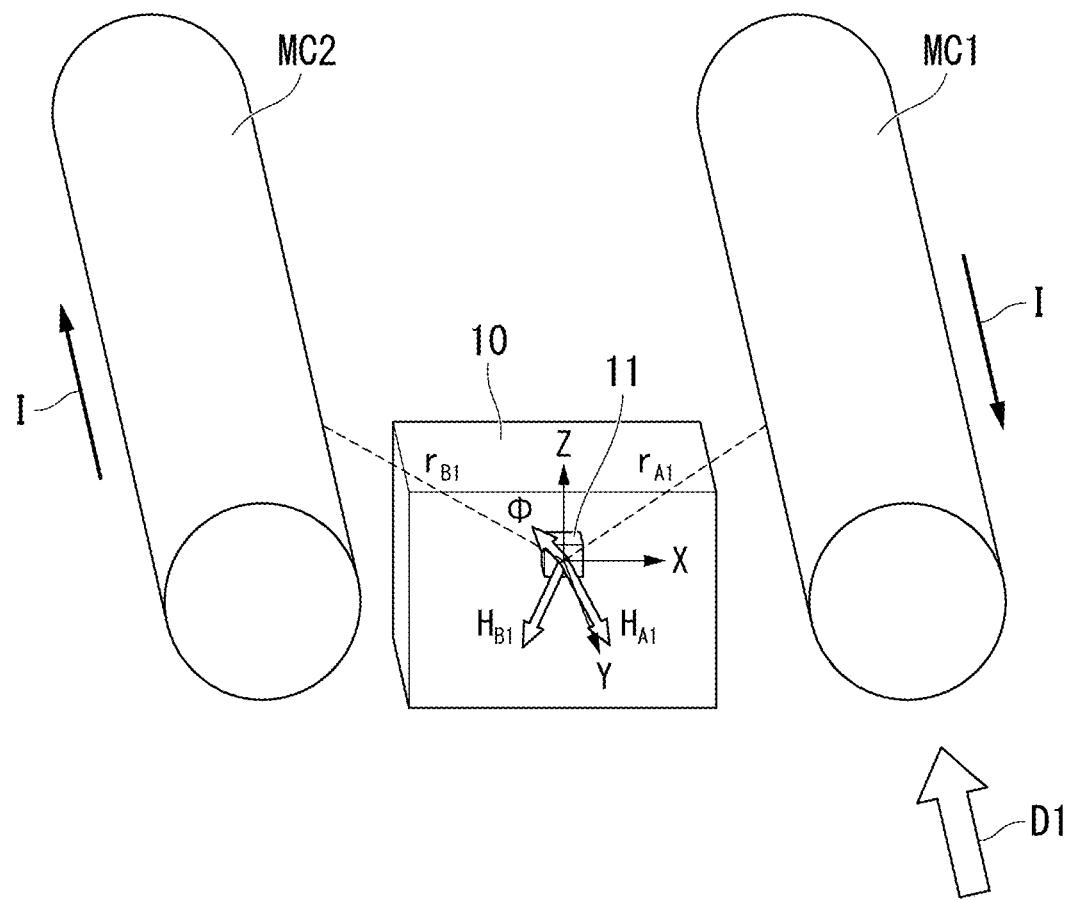
FIG. 3 is a diagram for describing a current measurement principle of the current measurement device according to the embodiment of the present invention.

Next, a current measurement principle in the current measurement device 1 will be described. FIG. 3 is a diagram for describing the current measurement principle in the current measurement device 1 according to the embodiment of the present invention. In FIG. 3, only the triaxial magnetic sensor 11 provided on the sensor head 10 is shown in consideration of visibility and the triaxial magnetic sensors 12, 13, and 14 are not shown. First, as shown in FIG. 3, a coordinate system (an XYZ Cartesian coordinate system) related to the sensor head 10 is set.

The XYZ Cartesian coordinate system is a coordinate system defined in accordance with a position and an orientation of the sensor head 10. In the above XYZ Cartesian coordinate system, the origin is set at the position of the triaxial magnetic sensor 11. Also, in the above XYZ Cartesian coordinate system, an X-axis is set in the first axis direction of the triaxial magnetic sensors 11, 12, 13, and 14 (an arrangement direction of the triaxial magnetic sensors 13, 11, and 12: see FIG. 1). Also, in this XYZ Cartesian coordinate system, a Y-axis is set in the second axis direction of the triaxial magnetic sensors 11, 12, 13, and 14. Also, in the above XYZ Cartesian coordinate system, a Z-axis is set in the third axis direction of the triaxial magnetic sensors 11, 12, 13, and 14 (an arrangement direction of the triaxial magnetic sensors 11 and 14: see FIG. 1).

Here, the positions of the triaxial magnetic sensors 11, 12, 13, and 14 are denoted by $P_m$ (m=1, 2, 3, 4). $P_m$ is a vector. That is, the position of the triaxial magnetic sensor 11 is denoted by $P_1$. Also, the position of the triaxial magnetic sensor 12 is denoted by $P_2$. Also, the position of the triaxial magnetic sensor 13 is denoted by $P_3$. Also, the position of the triaxial magnetic sensor 14 is denoted by $P_4$. For example, assuming that distances between the triaxial magnetic sensors 13, 11, and 12 in the X direction and distances between the triaxial magnetic sensors 11 and 14 in the Z direction are d [m] (see FIG. 1), the positions of the triaxial magnetic sensors 11, 12, 13, and 14 are represented as follows.

Position of triaxial magnetic sensor 11: $P_1=(0, 0, 0)$
Position of triaxial magnetic sensor 12: $P_2=(d, 0, 0)$
Position of triaxial magnetic sensor 13: $P_3=(-d, 0, 0)$
Position of triaxial magnetic sensor 14: $P_4=(0, 0, -d)$ Here, magnetic fields formed at the positions of the triaxial magnetic sensors 11, 12, 13, and 14 due to the current I flowing through the conductor MC1 to be measured are denoted by $H_{Am}$ (m=1, 2, 3, 4). Furthermore, $H_{Am}$ is a vector. That is, the magnetic field formed at the position of the triaxial magnetic sensor 11 due to the current I flowing through the conductor MC1 to be measured is denoted by $H_{A1}$. Also, the magnetic field formed at the position of the triaxial magnetic sensor 12 due to the current I flowing through the conductor MC1 to be measured is denoted by $H_{A2}$. Likewise, the magnetic field formed at the position of the triaxial magnetic sensor 13 due to the current I flowing through the conductor MC1 to be measured is denoted by $H_{A3}$. Also, the magnetic field formed at the position of the triaxial magnetic sensor 14 due to the current I flowing through the conductor MC1 to be measured is denoted by $H_{A4}$.

Further, as shown in FIG. 3, the magnetic fields formed at the positions of the triaxial magnetic sensors 11, 12, 13, and 14 due to the current I flowing through the conductor MC2 to be measured are denoted by $H_{Bm}$ (m=1, 2, 3, 4). Furthermore, $H_{Bm}$ is a vector. That is, the magnetic field formed at the position of the triaxial magnetic sensor 11 by the current I flowing through the conductor MC2 to be measured is denoted by $H_{B1}$. Also, the magnetic field formed at the position of the triaxial magnetic sensor 12 due to the current I flowing through the conductor MC2 to be measured is denoted by $H_{B2}$. Also, the magnetic field formed at the position of the triaxial magnetic sensor 13 due to the current I flowing through the conductor MC2 to be measured is denoted by $H_{B3}$. Also, the magnetic field formed at the position of the triaxial magnetic sensor 14 due to the current I flowing through the conductor MC2 to be measured is denoted by $H_{B4}$.

Also, the background magnetic field that uniformly acts on the triaxial magnetic sensors 11, 12, 13, and 14 is denoted by $\Phi$. Furthermore, $\Phi$ is a vector. The magnetic fields $H_m$ (m=1, 2, 3, 4) formed at the positions of the triaxial magnetic sensors 11, 12, 13, and 14 due to the currents I flowing through the conductors MC1 and MC2 to be measured are expressed by the following Eq. (1). Furthermore, $H_m$ is a vector.

[Math. 3]

$$H_m = H_{Am} - H_{Bm} + \Phi \tag{1}$$

Also, the magnetic fields $H_m$ formed at the positions of the triaxial magnetic sensors 11, 12, 13, and 14 are expressed by the following Eq. (2) according to Ampere's law.

[Math. 4]

$$H_m = \frac{I(j \times r_{Am})}{2\pi \|r_{Am}\|^2} - \frac{I(j \times r_{Bm})}{2\pi \|r_{Bm}\|^2} + \Phi \tag{2}$$

A first term on the right side of the above Eq. (2) represents magnetic fields formed at the positions of the triaxial magnetic sensors 11, 12, 13, and 14 due to the current I flowing through the conductor MC1 to be measured (i.e., $H_{Am}$ in the above Eq. (1)). A second term on the right side of the above Eq. (2) represents magnetic fields formed at the positions of the triaxial magnetic sensors 11, 12, 13, and 14 due to the current I flowing through the conductor MC2 to be measured (i.e., $H_{Bm}$ in the above Eq. (1)). A sign of the second term on the right side of the above Eqs. (1) and (2) is negative because the direction of the current I flowing through the conductor MC2 to be measured is opposite to the direction of the current I flowing through the conductor MC1 to be measured.

$r_{Am}$ in the above Eq. (2) denotes a vector parallel to a perpendicular line drawn from each of the triaxial magnetic sensors 11, 12, 13, and 14 to the conductor MC1 to be measured. $r_{Bm}$ in the above Eq. (2) denotes a vector parallel to a perpendicular line drawn from each of the triaxial magnetic sensors 11, 12, 13, and 14 to the conductor MC2 to be measured. Also, j in the above Eq. (2) is a unit vector in the direction of the current I.

Here, it is assumed that E is a unit matrix. Also, the position of the conductor MC1 to be measured is denoted by $V_A$. Also, the position of the conductor MC2 to be measured is denoted by VdB. Furthermore, $V_A$ and $V_B$ are vectors. The vectors $r_{Am}$ and $r_{Bm}$ in the above Eq. (2) are expressed by the following Eqs. (3).

[Math. 5]

$$r_{Am} = (E - jj^T)(P_m - V_A)$$

$$r_{Bm} = (E - jj^T)(P_m - V_B) \tag{3}$$

Because the directions of the currents I flowing through the conductors MC1 and MC2 to be measured are orthogonal to the direction of the magnetic field, a direction of an outer product of differences between the detection results of the triaxial magnetic sensors 11, 12, 13, and 14 matches the direction of the current I. Thus, the unit vector j in the direction of the current I is expressed by the following Eq. (4) using, for example, the detection results (the magnetic fields $H_1$, $H_2$, and $H_3$) of the triaxial magnetic sensors 11, 12, and 13.

[Math. 6]

$$j = \frac{(H_3 - H_1) \times (H_2 - H_1)}{\|(H_3 - H_1) \times (H_2 - H_1)\|} \tag{4}$$

Next, a complex plane F perpendicular to the unit vector j expressed by the above Eq. (4) is taken into account. The above complex plane F is taken into account to simplify the calculation process.

Figure 4:
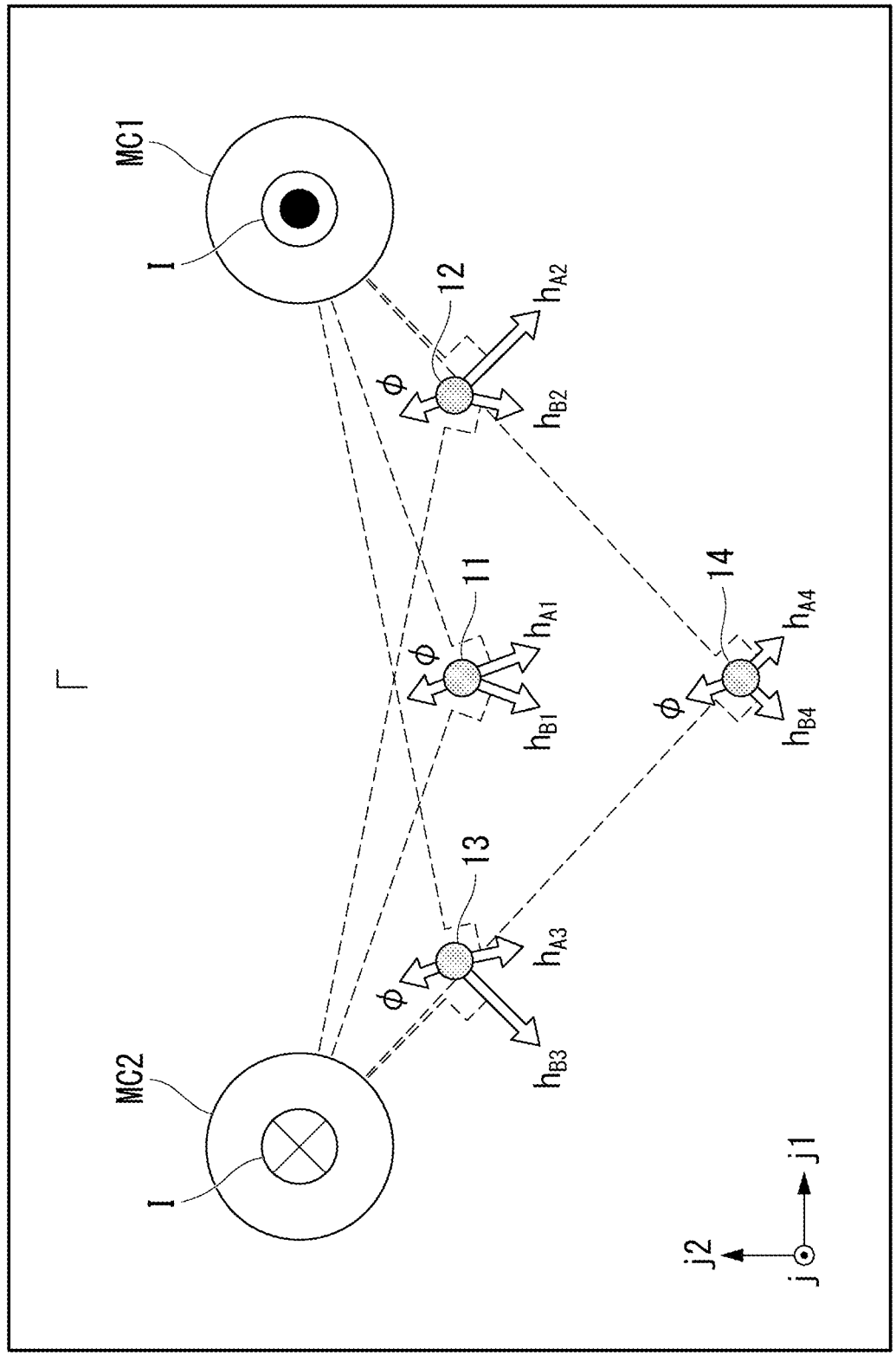
FIG. 4 is a view of conductors to be measured and triaxial magnetic sensors when viewed from a direction D1 in FIG. 3.

FIG. 4 is a view of the conductors MC1 and MC2 to be measured and the triaxial magnetic sensors 11, 12, 13, and 14 when viewed from a direction D1 in FIG. 3. Furthermore, j1 and j2 in FIG. 4 denote unit vectors orthogonal to each other within the complex plane F. The direction D1 in FIG. 3 is a direction along a longitudinal direction of the conductors MC1 and MC2 to be measured (i.e., a direction opposite to the direction of the current I flowing through the conductor MC1 to be measured or a direction along the direction of the current I flowing through the conductor MC2 to be measured). Furthermore, in FIG. 4, the conductors MC1 and MC2 to be measured and the triaxial magnetic sensors 11, 12, 13, and 14 are shown in a state in which the illustration of the sensor head 10 is omitted for ease of understanding.

The conductors MC1 and MC2 to be measured, the triaxial magnetic sensors 11, 12, 13, and 14, and the magnetic fields formed at the positions of the triaxial magnetic sensors 11, 12, 13, 14 are projected onto the complex plane F shown in FIG. 4. As shown in FIG. 4, the magnetic fields formed at the positions of the triaxial magnetic sensors 11, 12, 13, and 14 are orthogonal to the unit vector j due to the current I flowing in a direction perpendicular to the paper surface (i.e., a direction along the unit vector j or a direction opposite to the unit vector j). Accordingly, the magnetic fields formed at the positions of the triaxial magnetic sensors 11, 12, and 13 can be projected onto the complex plane Γ orthogonal to the direction in which the current I flows, without changing its magnitude.

Here, the positions of the triaxial magnetic sensors 11, 12, 13, and 14 on the complex plane Γ are denoted by $p_m$ (in =1, 2, 3, 4). Also, the position of the conductor MC1 to be measured on the complex plane Γ is denoted by $v_A$. Also, the position of the conductor MC2 to be measured on the complex plane Γ is denoted by $v_B$. Also, the magnetic fields $h_m$ (i=1, 2, 3, 4) projected onto the complex plane Γ is expressed by the following Eq. (5). $h_{Am}$, $h_{Bm}$, and $\phi$ in the following Eq. (5) are obtained by projecting $H_{Am}$, $H_{Bm}$, and $\Phi$ in the above Eq. (1) onto the complex plane F, respectively.

[Math. 7]

$$h_m = h_{Am} - h_{Bm} + \varphi \tag{5}$$

The magnetic fields $h_m$ at the positions of the triaxial magnetic sensors 11, 12, 13, and 14 on the projected complex plane Γ are expressed by the following Eq. (6). Furthermore, i in the following Eq. (6) is an imaginary unit.

[Math. 8]

$$h_m = \frac{iI}{2\pi(p_m - v_A)^*} - \frac{iI}{2\pi(p_m - v_B)^*} + \varphi \tag{6}$$

By modifying the above Eq. (6), the following Eq. (7) can be obtained.

[Math. 9]

$$I = \left| 2\pi(h_m - \varphi) \frac{(p_m - v_A)^*(p_m - v_B)^*}{(v_A - v_B)^*} \right| \tag{7}$$

The magnetic fields $h_m$ in the above Eq. (7) are obtained by projecting the detection results (the magnetic fields $H_m$) of the triaxial magnetic sensors 11, 12, 13, and 14 onto the complex plane Γ. The positions $p_m$ are obtained by projecting the positions $P_m$ of the triaxial magnetic sensors 11, 12, 13, and 14 onto the complex plane Γ. Thus, the magnetic fields $h_m$ and the positions $p_m$ can be calculated in a calculation process. Consequently, the currents I flowing through the conductors MC1 and MC2 to be measured can be calculated using the above Eq. (7) if the positions $v_A$ and $v_B$ of the conductors MC1 and MC2 to be measured on the complex plane Γ and the background magnetic field $\phi$ on the complex plane Γ are obtained.

Thus, a process of estimating the positions $v_A$ and $v_B$ of the conductors MC1 and MC2 to be measured on the complex plane Γ and the background magnetic field $\phi$ on the complex plane Γ from the magnetic fields projected onto the complex plane Γ is conceivable. The following Eq. (8) can be obtained by moving the third term ($\phi$) on the right side of the above Eq. (6) to the left side, multiplying both sides by the complex conjugate of the left side, and arranging the equation by canceling the denominator.

[Math. 10]

$$h_m^*(v_A v_B - (v_A + v_B)p_m + p_m^2) + \varphi^*((v_A - v_B)p_m - p_m^2) = \tag{8}$$

$$-\frac{iI}{2\pi}(v_A - v_B) + \varphi^* v_A v_B$$

Here, the right side of the above Eq. (8) is a constant that does not depend on the subscript m. Thus, as shown in the following Eq. (9), the right side of the above Eq. (8) is set as a variable k. Also, as shown in the following Eq. (9), a sum of the positions $V_A$ and $V_B$ of the conductors MC1 and MC2 to be measured is set as a variable v.

[Math. 11]

$$k = -\frac{iI}{2\pi}(v_A - v_B) + \varphi^* v_A v_B \tag{9}$$

$$v = v_A + v_B$$

When both sides of the above Eq. (8) are divided by $h_m^*$, the following Eq. (10) is obtained.

[Math. 12]

$$v_A v_B - v p_m + p_m^2 + \frac{\varphi^* v p_m}{h_m^*} - \frac{\varphi^* p_m^2}{h_m^*} - \frac{k}{h_m^*} = 0 \tag{10}$$

If the case in which m=1 in the above Eq. (8) is subtracted from the above Eq. (8) and the denominator is canceled by $h_m^*$, $h_1^*$, the following Eq. (11) is obtained.

[Math. 13]

$$(h_1^* p_m - h_m^* p_1)v\phi^* - h_m^* h_1^*(p_m - p_1)v - \tag{11}$$

$$\left(h_1^* p_m^2 - h_m^* p_1^2\right)\varphi^* + (h_m^* - h_1^*)k + h_m^* h_1^*\left(p_m^2 - p_1^2\right) = 0$$

Referring to the above Eq. (11), a quadratic homogeneous simultaneous equation related to the background magnetic field $\phi^*$, the variable v, and the variable k is given. Because the above Eq. (11) is established when m>1, the background magnetic field $\phi^*$, the variable v (=$v_A + v_B$), and the variable k can be calculated by solving the equation.

Hereinafter, an example of a method of solving the quadratic homogeneous simultaneous equations shown in the above Eq. (11) is shown. Assuming that coefficients of the above Eq. (11) are denoted by $a_m$, $b_m$, $c_m$, $d_m$, and $e_m$, the above Eq. (11) is expressed by the following Eq. (12).

[Math. 14]

$$a_m v \varphi^* + b_m v + c_m \varphi^* + d_m k + e_m = 0 \tag{12}$$

$$a_m = h_1^* p_m - h_m^* p_1$$

$$b_m = -h_m^* h_1^*(p_m - p_1)$$

$$c_m = -(h_1^* p_m^2 - h_m^* p_1^2)$$

$$d_m = h_m^* - h_1^*$$

$$e_m = h_m^* h_1^*(p_m^2 - p_1^2)$$

Using the above Eq. (11) when the subscript is in and the above Eq. (11) when the subscript is n, the following Eq. (13) can be obtained by eliminating the variable k.

[Math. 15]

$$(a_m d_n - a_n d_m)v\varphi^* + (b_m d_n - b_n d_m)v + (c_m d_n - c_n d_m)\varphi^* + (e_m d_n - e_n d_m) = 0 \tag{13}$$

Assuming that coefficients of the above Eq. (13) are denoted by $A_{mn}$, $B_{mn}$, $C_{mn}$, and $D_{mn}$, the above Eq. (13) is expressed by the following Eq. (14).

[Math. 16]

$$A_{mn} v\varphi^* + B_{mn} v + C_{mn}\varphi^* + D_{mn} k = 0 \tag{14}$$

$$A_{mn} = a_m d_n - a_n d_m$$

$$B_{mn} = b_m d_n - b_n d_m$$

$$C_{mn} = c_m d_n - c_n d_m$$

$$D_{mn} = e_m d_n - e_n d_m$$

From the above Eq. (14), the variable v can be expressed by the following Eq. (15) as a function of the background magnetic field $\phi^*$.

[Math. 17]

$$v = \frac{C_{mn}\varphi^* - D_{mn}}{A_{mn}\varphi^* - B_{mn}} \tag{15}$$

Now, when there are four triaxial magnetic sensors 11, 12, 13, and 14, the above Eq. (15) is established in the case of (m, n)=(1, 2) and the case of (m, n)=(2, 3) and the following Eq. (16) is established.

[Math. 18]

$$\frac{C_{12}\varphi^* - D_{12}}{A_{12}\varphi^* - B_{12}} = \frac{C_{23}\varphi^* - D_{23}}{A_{23}\varphi^* - B_{23}} \tag{16}$$

If the denominators of the above Eq. (16) are canceled and the above Eq. (16) is summarized as the equation of $\phi^*$, the following Eq. (17) is given.

[Math. 19]

$$(-A_{12}C_{23}+A_{23}C_{12})\varphi^{*2}+(-A_{12}D_{23}+A_{23}D_{12}-B_{12}C_{23}+B_{23}C_{12})\varphi^*-B_{12}D_{23}+B_{23}D_{12}=0 \tag{17}$$

Assuming that coefficients of the above Eq. (17) are denoted by $\alpha$, $\beta$, and $\gamma$, the above Eq. (17) is expressed by the following Eq. (18).

[Math. 20]

$$\alpha\varphi^{*2}+\beta\varphi^*+\gamma=0 \tag{18}$$

$$\alpha=-A_{12}C_{23}+A_{23}C_{12}$$

$$\beta=-A_{12}D_{23}+A_{23}D_{12}-B_{12}C_{23}+B_{23}C_{12}$$

$$\gamma=-B_{12}D_{23}+B_{23}D_{12}$$

Because the above Eq. (18) is a quadratic equation of $\phi^*$, the background magnetic field $\phi^*$ can be calculated from the following Eq. (19). Furthermore, two background magnetic fields $\phi^*$ can be obtained using the unknown variable k, but only one background magnetic field $\phi^*$ satisfies Eq. (6). Thereby, the background magnetic field $\phi^*$ on the complex plane Γ is estimated.

[Math. 21]

$$\varphi^* = \frac{-\beta \pm \sqrt{\beta^2 - 4\alpha\gamma}}{2\alpha} \tag{19}$$

By substituting the background magnetic field $\phi^*$ calculated from the above Eq. (19) into the above Eq. (15), the variable v (=$v_A + v_B$) can be calculated. Further, by substituting the calculated background magnetic field $\phi^*$ and the calculated variable v into the above Eq. (12), the variable k can be calculated.

Finally, when the calculated background magnetic field $\phi^*$, the calculated variable v, and the calculated variable k are substituted into the above Eq. (10), a product ($v_A v_B$) of the positions $v_A$ and vs of the conductors MC1 and MC2 to be measured on the complex plane Γ can be calculated. According to the above, the sum ($v=v_A+v_B$) and the product ($v_A v_B$) of the positions $v_A$ and vs of the conductors MC1 and MC2 to be measured on the complex plane Γ can be calculated. Consequently, the position $v_A$ of the conductor MC1 to be measured on the complex plane Γ and the position $v_B$ of the conductor MC2 to be measured on the complex plane T can be estimated.

As described above, the background magnetic field φ* on the complex plane Γ is estimated from the above Eq. (19). Also, the positions $v_A$ and $v_B$ of the conductors MC1 and MC2 to be measured on the complex plane Γ are estimated from the above Eq. (10). Consequently, by substituting the background magnetic field φ and the positions $v_A$ and $v_B$ of the conductors MC1 and MC2 to be measured into the above Eq. (7), the currents I flowing through the conductors MC1 and MC2 to be measured can be calculated.

Furthermore, by modifying the above Eq. (2), the following Eq. (20) can be obtained.

[Math. 22]

$$I = 2\pi(H_m - \Phi) \frac{\|r_{Am}\|^2 \|r_{Bm}\|^2}{\|r_{Bm}\|^2 (j \times r_{Am}) - \|r_{Am}\|^2 (j \times r_{Bm})} \quad (20)$$

The magnetic fields $H_m$ in the above Eq. (20) are the detection results of the triaxial magnetic sensors 11, 12, 13, and 14. In the above Eq. (20), j is a unit vector in the direction of the current I. j is calculated from the above Eq. (4) using the detection results (the magnetic fields $H_1$, $H_2$, and $H_3$) of the triaxial magnetic sensors 11, 12, and 13. Consequently, the currents I flowing through the conductors MC1 and MC2 to be measured can be calculated using the above Eq. (20) if the background magnetic field and the vectors $r_{Am}$ and $r_{Bm}$ parallel to the perpendicular lines drawn from each of the triaxial magnetic sensors 11, 12, 13, and 14 to the conductors MC1 and MC2 to be measured are obtained.

The background magnetic field D can be obtained by restoring the background magnetic field φ on the complex plane Γ estimated from the above Eq. (19) to the XYZ Cartesian coordinate system. Also, the vectors $r_{Am}$ and $r_{Bm}$ can be obtained by restoring the positions $v_A$ and $v_B$ of the conductors MC1 and MC2 to be measured on the complex plane Γ to the XYZ Cartesian coordinate system, calculating the positions $V_A$ and $V_B$ of the conductors MC1 and MC2 to be measured, and substituting the calculated positions $V_A$ and $V_B$ into the above Eqs. (3). As described above, the currents I flowing through the conductors MC1 and MC2 to be measured can be measured using the above Eq. (7) or the above Eq. (20).

<Operation of Current Measurement Device>

Next, an operation when the currents I flowing through the conductors MC1 and MC2 to be measured using the current measurement device 1 are measured will be described. First, a user of the current measurement device 1 causes the sensor head 10 to be arranged in proximity to the conductors MC1 and MC2 to be measured so that the currents I flowing through the conductors MC1 and MC2 to be measured are measured. A position and an orientation of the sensor head 10 with respect to the conductor MC1 to be measured is arbitrary.

Figure 5:
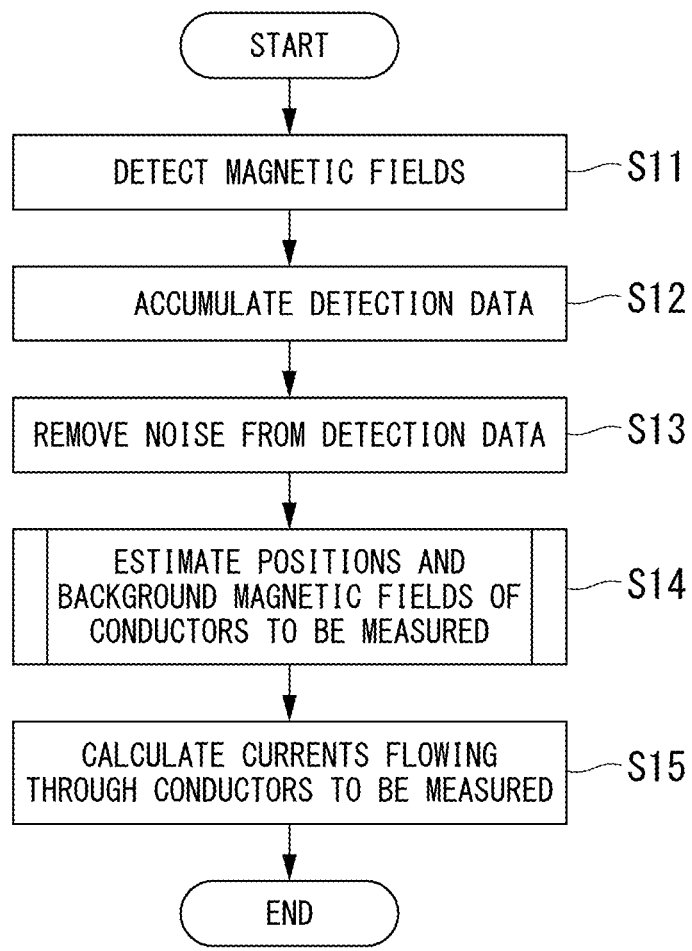
FIG. 5 is a flowchart showing an outline of an operation of the current measurement device according to the embodiment of the present invention.

FIG. 5 is a flowchart showing an overview of the operation of the current measurement device 1 according to the embodiment of the present invention. The flowchart shown in FIG. 5 is started, for example, at given intervals (for example, 1 second). When a process of the flowchart shown in FIG. 5 is started, the triaxial magnetic sensors 11, 12, 13, and 14 first detect magnetic fields formed by the currents I flowing through the conductors MC1 and MC2 to be measured (step S11). Furthermore, the magnetic fields are detected by the triaxial magnetic sensors 11, 12, 13, and 14, for example, about 1000 times per second. Next, the calculator 25 in the circuit 20 performs a process of accumulating detection data representing the detection results of the triaxial magnetic sensors 11, 12, 13, and 14 in the memory 23 (step S12).

Next, the noise remover 25a performs a process of removing noise from the detection data (step S13). Specifically, the noise remover 25a performs a process of removing noise components included in the detection data by reading the detection data stored in the memory 23 and performing an averaging process or a root sum square process on the read detection data. Furthermore, because the sign disappears when the root sum square process is performed, the sign is added separately. Here, the triaxial magnetic sensors 11, 12, 13, and 14 output three types of detection data for outputting the detection results of the three axes. The noise components are removed by the noise remover 25a separately for the detection data of each axis.

Subsequently, the position estimator 25b and the background magnetic field estimator 25c perform a process of estimating the positions and background magnetic fields of the conductors MC1 and MC2 to be measured (step S14).

FIG. 6 is a flowchart showing details of the processing of step S14 in FIG. 5. When the processing of step S14 is started, the calculator 25 first performs a process of calculating directions of the currents I flowing through the conductors MC1 and MC2 to be measured as shown in FIG. 6 (step S21). For example, the calculator 25 performs a process of calculating the unit vector j in the directions of the currents I flowing through the conductors MC1 and MC2 to be measured by performing the calculation process shown in the above Eq. (4) using the detection results of the triaxial magnetic sensors 11, 12, and 13.

Next, the calculator 25 performs a process of projecting the conductors MC1 and MC2 to be measured, the triaxial magnetic sensors 11, 12, 13, and 14, and the magnetic fields $H_m$ (in =1, 2, 3, 4) detected by the triaxial magnetic sensors 11, 12, 13, and 14 onto the complex plane Γ perpendicular to the current I (step S22). Here, the positions $V_A$ and $V_B$ of the conductors MC1 and MC2 to be measured are unknown. Thus, the positions $v_A$ and $v_B$ of the conductors MC1 and MC2 to be measured projected onto the complex plane Γ are unknown values. Furthermore, the background magnetic field φ on the complex plane Γ is also unknown.

On the other hand, the positions $P_m$ (m=1, 2, 3, 4) of the triaxial magnetic sensors 11, 12, 13, and 14 are known. Also, the magnetic fields $H_m$ detected by the triaxial magnetic sensors 11, 12, 13, and 14 are known. Thus, the positions $p_m$ (m=1, 2, 3, 4) of the triaxial magnetic sensors 11, 12, 13, and 14 projected onto the complex plane Γ and the magnetic fields $h_m$ (m=1, 2, 3, 4) projected onto the complex plane Γ are known values.

Subsequently, the background magnetic field estimator 25c performs a process of estimating an unknown background magnetic field φ on the complex plane Γ (step S23). Specifically, the background magnetic field estimator 25c performs the process of estimating the unknown background magnetic field φ using the above Eq. (19). Here, referring to the above-described Eqs. (18), (14), and (12), it can be seen that the coefficients α, β, and γ in the above Eq. (19) have the positions $p_m$ of the triaxial magnetic sensors 11, 12, 13, and 14 projected onto the complex plane Γ and the magnetic fields $h_m$ projected onto the complex plane Γ as elements. Thus, the background magnetic field estimator 25c estimates the unknown background magnetic field ϕ on the complex plane Γ based on the detection results of the triaxial magnetic sensors 11, 12, 13, and 14 and the positional relationships between the triaxial magnetic sensors 11, 12, 13, and 14.

Subsequently, the position estimator 25b performs a process of estimating the positions $v_A$ and $v_B$ of the conductors MC1 and MC2 to be measured, which are unknown values (step S24). Specifically, the position estimator 25b first performs a process of substituting the background magnetic field ϕ estimated in the processing of step S23 into the above Eq. (15) to calculate the variable v ($=v_A+v_B$). Furthermore, the coefficients $A_{mn}$, $B_{mn}$, $C_{mn}$, and $D_{mn}$ in Eq. (15) are calculated from the positions $p_m$ of the triaxial magnetic sensors 11, 12, 13, and 14 projected onto the complex plane Γ and the magnetic fields $h_m$ projected onto the complex plane Γ.

Next, a process of calculating the variable k by substituting the background magnetic field ϕ estimated in the processing of step S23 and the above variable v into the above Eq. (12) is performed. Furthermore, the coefficients $a_m$, $b_m$, $c_m$, $d_m$, and $e_m$ in Eq. (12) are calculated from the positions $p_m$ of the triaxial magnetic sensors 11, 12, 13, and 14 projected onto the complex plane Γ and the magnetic fields $h_m$ projected onto the complex plane Γ.

A process of calculating the product ($v_A v_B$) of the positions $v_A$ and $v_B$ of the conductors MC1 and MC2 to be measured on the complex plane Γ by substituting the estimated background magnetic field ϕ and the calculated variables v and k into the above Eq. (10) is performed. Finally, the positions $v_A$ and $v_B$ of the conductors MC1 and MC2 to be measured on the complex plane Γ are calculated from the sum ($v=v_A+v_B$) of the positions $v_A$ and $v_B$ calculated from the above Eq. (15) and the product ($v_A v_B$) of the positions $v_A$ and $v_B$ calculated from the above Eq. (10). In this way, the positions $v_A$ and $v_B$ of the conductors MC1 and MC2 to be measured are estimated.

When the above process is completed, the current calculator 25d performs a process of calculating the currents I flowing through the conductors MC1 and MC2 to be measured (step S15). Specifically, the current calculator 25d calculates the currents I flowing through the conductors MC1 and MC2 to be measured by performing a calculation process shown in the above Eq. (7) using the positions $p_m$ of the triaxial magnetic sensors 11, 12, 13, and 14 projected onto the complex plane Γ, the magnetic fields $h_m$ projected onto the complex plane Γ, and the positions $v_A$ and $v_B$ of the conductors MC1 and MC2 to be measured and the background magnetic field ϕ on the complex plane Γ estimated in the processing of step S14.

Furthermore, in step S15, the current calculator 25d may calculate the currents I flowing through the conductors MC1 and MC2 to be measured by performing the calculation process shown in the above Eq. (20) instead of the above Eq. (7). When the currents I are calculated by performing the calculation process shown in Eq. (20), the current calculator 25d first performs a process of obtaining the background magnetic field ϕ by restoring the background magnetic field ϕ on the complex plane Γ to the XYZ Cartesian coordinate system. Also, the current calculator 25d performs a process of obtaining the positions $v_A$ and $V_B$ of the conductors MC1 and MC2 to be measured by restoring the positions $v_A$ and $v_B$ of the conductors MC1 and MC2 to be measured on the complex plane Γ to the XYZ Cartesian coordinate system.

Next, the current calculator 25d performs a process of calculating the vectors $r_{Am}$ and $r_{Bm}$ by substituting the obtained positions $v_A$ and $V_B$ of the conductors MC1 and MC2 to be measured and the positions $P_m$ of the triaxial magnetic sensors 11, 12, 13, and 14 into the above Eqs. (3). The current calculator 25d calculates the currents I flowing through the conductors MC1 and MC2 to be measured by performing the calculation process shown in the above Eq. (20) using the unit vector j calculated in step S21 of FIG. 6 and the magnetic fields $H_{ill}$ detected by the triaxial magnetic sensors 11, 12, 13, and 14 in addition to the background magnetic fields Φ and the vectors $r_{Am}$ and $r_{Bm}$ obtained in the above process.

As described above, in the present embodiment, the currents I flowing through the conductors MC1 and MC2 to be measured are measured using the detection results of the triaxial magnetic sensors 11, 12, 13, and 14 and the positional relationships between the triaxial magnetic sensors 11, 12, 13, and 14. Here, in the present embodiment, the position and the orientation of the sensor head 10 with respect to the conductors MC1 and MC2 to be measured may be arbitrary. Also, the detection results of the triaxial magnetic sensors 11, 12, 13, and 14 can be obtained regardless of whether the current I is a direct current or an alternating current. Thus, in the present embodiment, a flexible arrangement is possible, currents flow in mutually opposite directions, and a direct current and an alternating current of a low frequency (for example, several hundred hertz [Hz]) flowing through the current paths (the conductors MC1 and MC2 to be measured) arranged in proximity to each other can be measured accurately in a non-contact mode.

Also, in the present embodiment, the sensor head 10 in which the triaxial magnetic sensors 11, 12, 13, and 14 are provided and the circuit 20 in which the calculator 25 is provided are separated and connected by a cable CB. Thereby, because the handling of the sensor head 10 is facilitated, and for example, the sensor head 10 can be easily installed within a small space, the sensor head 10 can be arranged more flexibly.

Although the current measurement device according to the embodiment of the present invention has been described above, the present invention is not limited to the above embodiment and can be freely changed within the scope of the present invention. For example, in the above-described embodiment, an example in which the triaxial magnetic sensors 13, 11, and 12 are separated at intervals d [m] in the first axis direction (the x-axis direction), and the triaxial magnetic sensors 11 and 14 are separated an interval d [m] in the third axis direction (the z-axis direction) has been described. However, the triaxial magnetic sensors 11, 12, 13, and 14 have any relative positional relationship as long as magnetism-sensing directions thereof are set in parallel to each other.

REFERENCE SIGNS LIST

1 Current measurement device
10 Sensor head
11 to 14 Triaxial magnetic sensor
20 Circuit
25 Calculator
25a Noise remover
25b Position estimator
25c Background magnetic field estimator
25d Current calculator I Current
MC1 Conductor to be measured
MC2 Conductor to be measured
$V_A$, $v_A$ Position of conductor to be measured
$V_B$, $v_B$ Position of conductor to be measured
$\phi$, $\Phi$ Background magnetic field

The invention claimed is:

1. A current measurement device comprising:
four or more triaxial magnetic sensors proximate to a pair of conductors such that magnetism-sensing directions thereof are parallel to each other; and
a calculator configured to calculate current flowing through the pair of conductors, the pair of conductors being arranged in proximity to each other, the current flowing in mutually opposite directions in the pair of conductors, the current being calculated by using an equation of:

$$I = \left| 2\pi(h_m - \varphi)\frac{(p_m - v_A)^*(p_m - v_B)^*}{(v_A - v_B)^*} \right|,$$

wherein magnetic fields obtained by projecting detection results of the four or more triaxial magnetic sensors onto a complex plane are denoted by $h_m$,
the current flowing through the pair of conductors are denoted by I,
positions of the four or more triaxial magnetic sensors projected onto the complex plane are denoted by $p_m$,
the positions of the pair of conductors on the complex plane are denoted by $V_A$ and $V_B$,
m is a variable, and
a background magnetic field on the complex plane is denoted by $\phi$.

2. The current measurement device according to claim 1, wherein the calculator further comprises a noise remover configured to remove noise components included in the detection results of the four or more triaxial magnetic sensors, and
wherein the calculator calculates the current flowing through the pair of conductors using the detection results of the four or more triaxial magnetic sensors from which the noise components have been removed by the noise remover.

3. The current measurement device according to claim 2, wherein the noise remover removes the noise components included in the detection results of the four or more triaxial magnetic sensors by separately performing an averaging process or a root sum square process on each of the detection results of the four or more triaxial magnetic sensors obtained for each predefined given period.

4. The current measurement device according to claim 1, the current measurement device comprising:
a sensor head comprising the four or more triaxial magnetic sensors; and
a circuit comprising the calculator.

5. The current measurement device according to claim 1, wherein signals indicating the detection results of the four or more triaxial magnetic sensors are digital signals.

6. A current measurement device comprising:
four or more triaxial magnetic sensors proximate to a pair of conductors such that magnetism-sensing directions thereof are parallel to each other; and
a calculator configured to calculate current flowing through the pair of conductors, the pair of conductors being arranged in proximity to each other, the current flowing in mutually opposite directions in the pair of conductors, the current being calculated by using an equation of:

$$I = 2\pi(H_m - \Phi)\frac{\|r_{Am}\|^2 \|r_{Bm}\|^2}{\|r_{Bm}\|^2(j \times r_{Am}) - \|r_{Am}\|^2(j \times r_{Bm})},$$

wherein, magnetic fields, which are detection results of the four or more triaxial magnetic sensors, are denoted by $H_m$,
the current flowing through the pair of conductors are denoted by I,
a unit vector of a direction in which the current I flows is denoted by j,
a background magnetic field obtained by restoring a background magnetic field on a complex plane to an XYZ Cartesian coordinate system is denoted by $\Phi$,
m is a variable, and
vectors parallel to perpendicular lines drawn from each of the four or more triaxial magnetic sensors to the pair of conductors are denoted by $r_{Am}$ and $r_{Bm}$.

* * * * *